United States Patent
Nagaiwa

(10) Patent No.: US 10,714,318 B2
(45) Date of Patent: Jul. 14, 2020

(54) PLASMA PROCESSING METHOD

(71) Applicant: TOKYO ELECTRON LIMITED, Tokyo (JP)

(72) Inventor: Toshifumi Nagaiwa, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/282,828

(22) Filed: Feb. 22, 2019

(65) Prior Publication Data

US 2019/0267217 A1    Aug. 29, 2019

(30) Foreign Application Priority Data

Feb. 23, 2018    (JP) ................. 2018-030501

(51) Int. Cl.
*H01L 21/3065*    (2006.01)
*H01J 37/32*    (2006.01)

(52) U.S. Cl.
CPC .. *H01J 37/32642* (2013.01); *H01J 37/32715* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 2005/0230049 A1* | 10/2005 | Nishio | ............ | H01J 37/32082 156/345.51 |
| 2007/0224709 A1 | 9/2007 | Ogasawara | | |
| 2008/0000876 A1* | 1/2008 | Park | ............ | H01J 37/32623 216/67 |
| 2010/0025369 A1* | 2/2010 | Negishi | ............ | H01J 37/32642 216/60 |
| 2017/0178872 A1* | 6/2017 | Kishi | ............ | H01J 37/32798 |

FOREIGN PATENT DOCUMENTS

| | | | | |
|---|---|---|---|---|
| JP | 2007-258417 A | | 10/2007 | |
| JP | 2017112275 A | * | 6/2017 | ........ H01J 37/32926 |

* cited by examiner

*Primary Examiner* — Shamim Ahmed
(74) *Attorney, Agent, or Firm* — Rothwell, Figg, Ernst & Manbeck, P.C.

(57) ABSTRACT

In a plasma processing method, a position in height direction of an upper surface of a focus ring surrounding an edge of a substrate mounted on a supporting table in a chamber of a plasma processing apparatus is set such that the position in height direction of the upper surface of the focus ring mounted on a mounting region of the supporting table is lower than a reference position that is a position in a height direction of an upper surface of the substrate. Plasma is generated in the chamber to perform plasma processing on the substrate in a state where the position in the height direction of the upper surface of the focus ring is maintained. A negative DC voltage is applied to the focus ring in a state where the position in height direction of the upper surface of the focus ring is maintained during the plasma generation.

16 Claims, 9 Drawing Sheets

PLASMA PROCESSING METHOD

CROSS-REFERENCE TO RELATED APPLICATIONS

This application claims priority to Japanese Patent Application No. 2018-030501 filed on Feb. 23, 2018, the entire contents of which are incorporated herein by reference.

TECHNICAL FIELD

The present disclosure relates to a plasma processing method.

BACKGROUND

In manufacturing electronic devices, plasma processing is performed on a substrate by using a plasma processing apparatus. The plasma processing apparatus includes a chamber and a supporting table. The supporting table is provided in the chamber. In the plasma processing apparatus, the substrate is disposed on the supporting table in a region surrounded by a focus ring. The focus ring is used to ensure in-plane uniformity of the plasma processing. Specifically, the focus ring is used to adjust a shape of a sheath such that ions in plasma are vertically incident on edge region of the substrate.

The focus ring is consumed by the plasma processing. As the focus ring is consumed by the plasma processing, the thickness of the focus ring decreases. The decrease in the thickness of the focus ring leads to changes in the shape of the sheath. Accordingly, an incident direction of ions in the plasma on the edge region of the substrate is inclined inwardly with respect to a vertical direction. As a result, the in-plane uniformity of the plasma processing deteriorates. Japanese Patent Application Publication No. 2007-258417 discloses that a negative DC voltage is applied to a focus ring to correct a shape of a sheath that has changed by the decrease in the thickness of the focus ring.

It is not necessarily preferable that ions are vertically incident on the edge region of the substrate. For example, when a mask provided on a film of a substrate provides an opening that is outwardly inclined with respect to the vertical direction in the edge region of the substrate, ions need to be incident on the edge region of the substrate in a direction inclined inwardly with respect to the vertical direction in order to form a vertically extending opening in the film in the edge region by plasma etching. In the opposite case, ions need to be incident on the edge region of the substrate in a direction inclined outwardly with respect to the vertical direction. Therefore, it is required to control the incident direction of the ions on the edge region of the substrate to a desired direction between the direction inclined inwardly with respect to the vertical direction and the direction inclined outwardly with respect to the vertical direction.

SUMMARY

In accordance with an aspect, there is provided a plasma processing method comprising: (i) setting a position in a height direction of an upper surface of a focus ring that surrounds an edge of a substrate mounted on a supporting table in a chamber a plasma processing apparatus; (ii) generating plasma in the chamber to perform plasma processing on the substrate in a state where the position in the height direction of the upper surface of the focus ring is maintained; and (iii) applying a negative DC voltage to the focus ring in a state where the position in the height direction of the upper surface of the focus ring is maintained during the generation of the plasma. In the setting step, the focus ring having a thickness set such that the position in the height direction of the upper surface of the focus ring mounted on a mounting region of the supporting table is lower than a reference position that is a position in a height direction of an upper surface of the substrate mounted on the supporting table is loaded into the chamber and mounted on the mounting region to surround the edge of the substrate. Or, the focus ring is moved in the chamber such that the position in the height direction of the upper surface of the focus ring becomes lower than the reference position.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
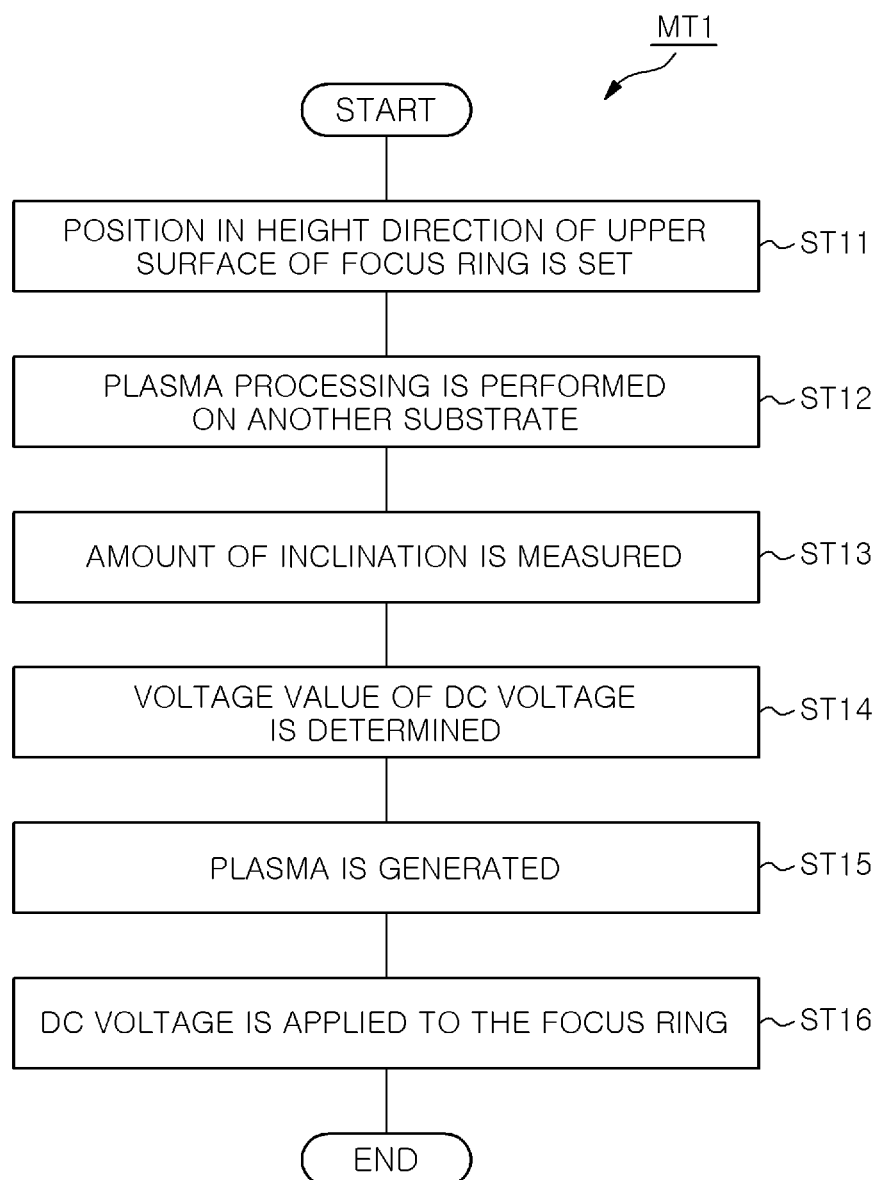
FIG. 1 is a flowchart showing a plasma processing method according to an embodiment.

Hereinafter, embodiments will be described in detail with reference to the accompanying drawings. Like reference numerals will be given to like or corresponding parts throughout the drawings.

Figure 2:
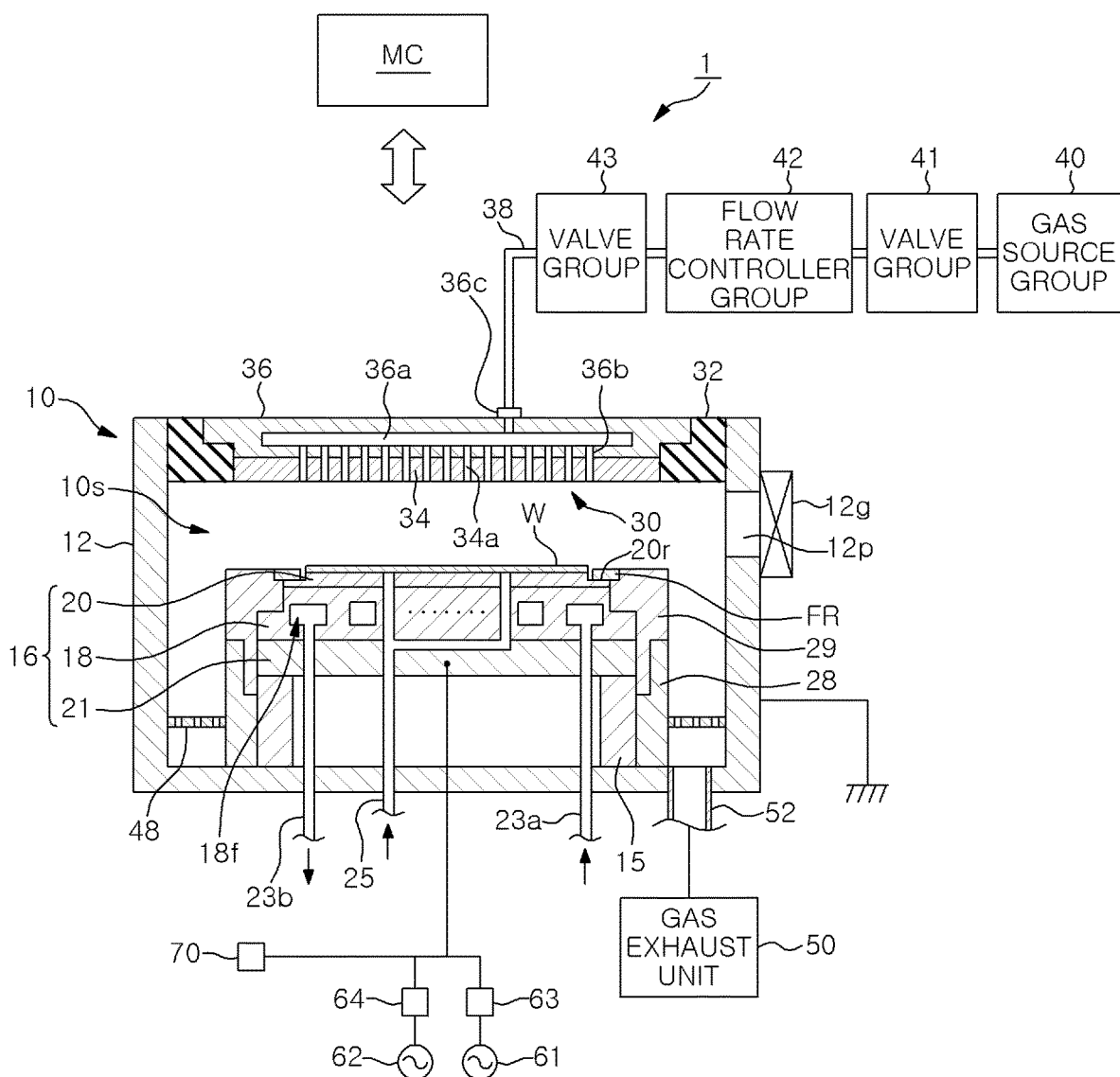
FIG. 2 schematically shows a plasma processing apparatus that can be used in a plasma processing method according to various embodiments.

FIG. 1 is a flowchart showing a plasma processing method according to an embodiment. The plasma processing method (hereinafter, referred to as "method MT1") shown in FIG. 1 is performed by using a plasma processing apparatus capable of applying a DC voltage to a focus ring. In one embodiment, the method MT1 can be performed by using a plasma processing apparatus shown in FIG. 2. FIG. 2 schematically shows the plasma processing apparatus that can be used in the plasma processing method according to various embodiments. The plasma processing apparatus 1 shown in FIG. 2 is a capacitively coupled plasma processing apparatus.

The plasma processing apparatus 1 includes a chamber 10. The chamber 10 has an inner space 10s therein. In one embodiment, the chamber 10 includes a chamber body 12. The chamber body 12 has a substantially cylindrical shape. The inner space 10s is provided in the chamber body 12. The chamber body 12 is made of, e.g., aluminum. The chamber body 12 is electrically grounded. A plasma resistant film is formed on an inner wall surface of the chamber body 12, i.e., on a wall surface of the chamber body 12 which defines the inner space 10s. This film may be a film formed by anodic oxide treatment, or a ceramic film made of yttrium oxide.

A passage 12p is formed in the sidewall of the chamber body 12. The substrate W is transferred between the inner space 10s and the outside of the chamber 10 through the passage 12p. A gate valve 12g is provided along the sidewall of the chamber body 12 to open and close the passage 12p.

A supporting table 16 is provided in the inner space 10s. The supporting table 16 is configured to support the substrate W mounted thereon. The supporting table 16 is supported by a supporting part 15. The supporting part 15 extends upward from a bottom portion of the chamber body 12. The supporting part 15 has a substantially cylindrical shape. The supporting part 15 is made of an insulating material such as quartz.

The supporting table 16 may include a lower electrode 18 and an electrostatic chuck 20. The supporting table 16 may further include an electrode plate 21. The electrode plate 21 is made of a conductive material such as aluminum and has a substantially disc shape. The lower electrode 18 is provided on the electrode plate 21. The lower electrode 18 is made of a conductive material such as aluminum and has a substantially disc shape. The lower electrode 18 is electrically connected to the electrode plate 21.

A flow path 18f is formed in the lower electrode 18. The flow path 18f is a channel for a heat exchange medium. As for the heat exchange medium, a liquid coolant or a coolant (e.g., Freon) for cooling the lower electrode 18 by vaporization thereof is used. A circulation device (e.g., a chiller unit) for the heat exchange medium is connected to the flow path 18f. This circulation device is provided outside the chamber 10. The heat exchange medium is supplied to the flow path 18f from the circulation device through a line 23a. The heat exchange medium supplied to the flow path 18f is returned to the circulation device through a line 23b.

The electrostatic chuck 20 is provided on the lower electrode 18. When the substrate W is processed in the inner space 10s, the substrate W is mounted and held on the electrostatic chuck 20. The electrostatic chuck 20 includes a main body and an electrode. The main body of the electrostatic chuck 20 is made of a dielectric material. The electrode of the electrostatic chuck 20 is a film-shaped electrode and is provided in the main body or the electrostatic chuck 20. A DC power supply is electrically connected to the electrode of the electrostatic chuck 20. When a voltage is applied from the DC power supply to the electrode of the electrostatic chuck 20, an electrostatic attractive force generated between the electrostatic chuck 20 and the substrate W. Due to the generated electrostatic attractive force thus generated, the substrate W is attracted to and held on the electrostatic chuck 20.

The plasma processing apparatus 1 may further include a gas supply line 25. A heat transfer gas, e.g., He gas, is supplied through the gas supply line 25 from a gas supply unit to a gap between an upper surface of the electrostatic chuck 20 and a backside (bottom surface) of the substrate W.

The plasma processing apparatus 1 may further include a tubular member 28 and an insulating member 29. The tubular member 28 extends upward from the bottom portion of the chamber body 12. The tubular member 28 extends along an outer periphery of the supporting part 15. The tubular member 28 is made of a conductor and has a substantially cylindrical shape. The tubular member 28 is electrically grounded. The insulating member 29 is provided on the tubular member 28. The insulating member 29 is made of an insulating material. The insulating member 29 is made of ceramic such as quartz. The insulating member 29 has a substantially cylindrical shape. The insulating member 29 extends along the outer peripheries of the electrode plate 21, the lower electrode 18 and the electrostatic chuck 20.

Figure 3:
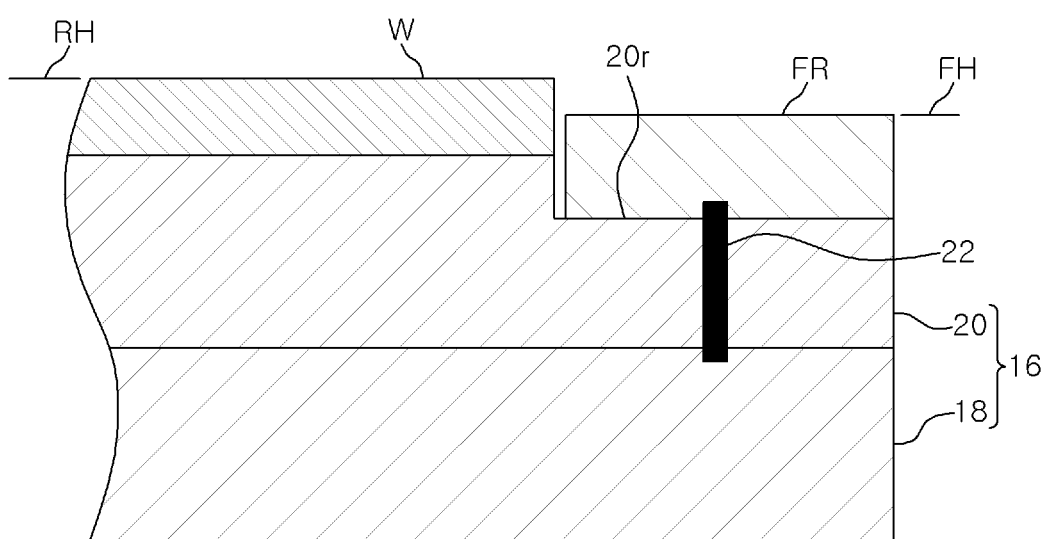
FIG. 3 is a partially enlarged cross-sectional view of a supporting table and a focus ring of the plasma processing apparatus shown in FIG. 2.

Hereinafter, FIGS. 2 and 3 will be referred to FIG. 3 is a partially enlarged cross-sectional view of the supporting table and the focus ring of the plasma processing apparatus shown in FIG. 2. The supporting table 16 has a mounting region 20r. The focus ring FR is mounted on the mounting region 20r. In one example, the mounting region 20r is an outer peripheral region of the electrostatic chuck 20. The focus ring FR has a substantially annular plate shape. The focus ring FR has conductivity. The focus ring FR is made of, e.g., silicon or silicon carbide (SiC). The substrate W has a circular shape when seen from the top and is mounted on the electrostatic chuck 20 in a region surrounded by the focus ring FR. In other words, the focus ring FR surrounds the edge of the substrate W mounted on the supporting table 16.

In the case of performing the plasma processing method according to various embodiments by using the plasma processing apparatus 1, the focus ring FR is loaded into the chamber 10 and mounted on the mounting region 20r to surround the edge of the substrate. The focus ring FR loaded into the chamber 10 has a thickness that is set such that a position FH in a height direction of an upper surface of the focus ring FR mounted on the mounting region 20r is lower than a position. (hereinafter, referred to as "reference position RH") in a height direction of an upper surface of the substrate W mounted on the supporting table 16, i.e., the electrostatic chuck 20.

As shown in FIG. 2, the plasma processing apparatus 1 further includes an upper electrode 30. The upper electrode 30 is provided above the supporting table 16. The upper electrode 30 blocks an upper opening of the chamber body 12 in cooperation with a member 32. The member 32 has an insulating property. The upper electrode 30 is held on an upper portion of the chamber body 12 through the member 32.

The upper electrode 30 includes a ceiling plate 34 and a holder 36. A bottom surface of the ceiling plate 34 defines the inner space 10s. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. This film may be a film formed by anodic oxidation treatment or a ceramic film made of yttrium oxide.

The holder 36 detachably holds the ceiling plate 34. The holder 36 is made of a conductive material, e.g., aluminum. A gas diffusion space 36a is formed inside the holder 36. A plurality of gas holes 36b extends downward from the gas diffusion space 36a. The gas holes 36b communicate with the respective gas injection holes 34a. A gas inlet port 36c is formed in the holder 36. The gas inlet port 36c is connected to the gas diffusion space 36a. A gas supply line 38 is connected to the gas inlet port 36c.

A gas source group 40 is connected to the gas supply line 38 through a valve group 41, a flow rate controller group 42, and a valve group 43. The gas source group 40 includes a plurality of gas sources. Each of the valve groups 41 and 43 includes a plurality of valves (e.g., on-off valves). The flow rate controller group 42 includes a plurality of flow rate controllers. Each of the flow rate controllers of the flow rate controller group 42 is a mass flow controller or a pressure control type flow controller. The gas sources of the gas source group 40 are respectively connected to the gas supply line 38 through corresponding valves of the valve group 41, corresponding flow controllers of the flow rate control group 42, and corresponding valves of the valve group 43. The plasma processing apparatus 1 can supply gases from one or more gas sources selected among the plurality of gas sources of the gas source group 40 to the inner space 10s at individually controlled flow rates.

A baffle plate 48 is provided between the tubular member 28 and the sidewall of the chamber body 12. The baffle plate 48 may be formed by coating ceramic such as yttrium oxide on an aluminum base material, for example. A plurality of through-holes is formed in the baffle plate 48. Below the baffle plate 48, a gas exhaust line 52 is connected to the bottom portion of the chamber body 12. A gas exhaust unit 50 is connected to the gas exhaust line 52.

The gas exhaust unit 50 includes a pressure controller such as an automatic pressure control valve, and a vacuum pump such as a turbo molecular pump, and thus can decrease a pressure in the inner space 10s.

The plasma processing apparatus 1 further includes a first radio frequency power supply 61. The first radio frequency power supply 61 generates a first radio frequency power for plasma generation. The first radio frequency power has a frequency ranging from 27 to 100 MHz, e.g., 40 MHz or 60 MHz. The first radio frequency power supply 61 is connected to the lower electrode 18 via a first matching unit 63 and the electrode plate 21 in order to supply the first radio frequency power to the lower electrode 18. The first matching unit 63 has a matching circuit for matching an output impedance of the first radio frequency power supply 61 and an impedance on a load side (the lower electrode 18 side). The first radio frequency power supply 61 may not be electrically connected to the lower electrode 18 and may be connected to the upper electrode 30 via the first matching unit 63.

The plasma processing apparatus 1 further includes a second radio frequency power supply 62. The second radio frequency power supply 62 generates a second radio frequency power for attracting ions to the substrate W (for bias). The frequency of the second radio frequency power is lower than the frequency of the first radio frequency power. The frequency of the second radio frequency power is within a range from 400 kHz to 13.56 MHz, e.g., 400 kHz. The second radio frequency power supply 62 is connected to the lower electrode 18 via a second matching unit 64 and the electrode plate 21 in order to supply the second radio frequency power to the lower electrode 18. The second matching unit 64 has a matching circuit for matching an output impedance of the second radio frequency power supply 62 and the impedance of the load side (the lower electrode 18 side).

In the plasma processing apparatus 1, a gas is supplied to the inner space 10s. Then, the gas is excited in the inner space 10s by supplying the first radio frequency power and/or the second radio frequency power. As a result, plasma is generated in the inner space 10s. The substrate W is processed by ions and/or radicals in the generated plasma.

The plasma processing apparatus 1 further includes a DC power supply 70. The DC power supply 70 is electrically connected to the focus ring FR. The DC power supply 70 generates a negative DC voltage to be applied to the focus ring FR to adjust the state of the plasma generated in the inner space 10s. As shown in FIG. 3, in one embodiment, the focus ring FR is electrically connected to the lower electrode 18 through a conductor 22. The conductor 22 penetrates through the electrostatic chuck 20. The DC power supply 70 is electrically connected to the focus ring FR via the electrode plate 21, the lower electrode 18 and the conductor 22. The DC power supply 70 may be electrically connected to the focus ring FR via another electrical path without passing through the electrode plate 21, the lower electrode 18 and the conductor 22.

The plasma processing apparatus 1 may further include a control unit MC. The control unit MC is a computer including a processor, a storage device, an input device, a display device and the like, and controls the respective components of the plasma processing apparatus 1.

Specifically, the control unit MC executes a control program stored in the storage device, and controls the respective components of the plasma processing apparatus 1 based on a recipe data stored in the storage device. In the plasma processing apparatus 1, a process specified by the recipe data can be performed under the control of the control unit MC. Further, in the plasma processing apparatus 1, the plasma processing method according to various embodiments can be performed under the control of the control unit MC.

Hereinafter, the case of performing the method MT1 by using the plasma processing apparatus 1 will be described in detail as an example. As shown in FIG. 1, in the method MT1, first, a step ST11 is executed. In the step ST11, the position FH in the height direction of the upper surface of the focus ring FR is set. As described above, when the plasma processing apparatus 1 is used, the focus ring FR is loaded into the chamber 10 and mounted on the mounting region 20r to surround the edge of the substrate. The focus ring FR loaded into the chamber 10 has a thickness that is set such that the position FH in the height direction of the upper surface of the focus ring FR mounted on the mounting region 20r is lower than the reference position RH (see FIG. 3).

The method MT1 further includes steps ST15 and ST16. In the method MT1, after the execution of the step ST11 and before the execution of the step ST15, the substrate W is loaded into the inner space 10s and mounted on the supporting table 16 (the electrostatic chuck 20) in the region surrounded by the focus ring FR. The steps ST15 and ST16 are executed in a state where the substrate W is mounted on the supporting table 16 in the region surrounded by the focus ring FR and the position FH set in the step ST11 is maintained.

In the step ST15, plasma is generated in the chamber 10 to perform plasma processing on the substrate W. Specifically, the valve group 41, the flow rate controller group 42 and the valve group 43 are controlled such that the gases from one or more sources selected among the plurality of gas sources of the gas source group 40 are supplied to the inner space 10s. In the step ST15, the gas exhaust unit 50 is controlled to set a pressure in the inner space 10s to a specified pressure. In the step ST15, the first radio frequency power supply 61 and/or the second radio frequency power supply 62 are controlled to supply the first radio frequency power and/or the second radio frequency power in order to excite the gas in the inner space 10s.

The step ST16 is executed during the execution of the step ST15, i.e., during the generation of the plasma. In the step ST16, the DC power supply 70 is controlled to apply a negative DC voltage to the focus ring FR.

Figure 4:
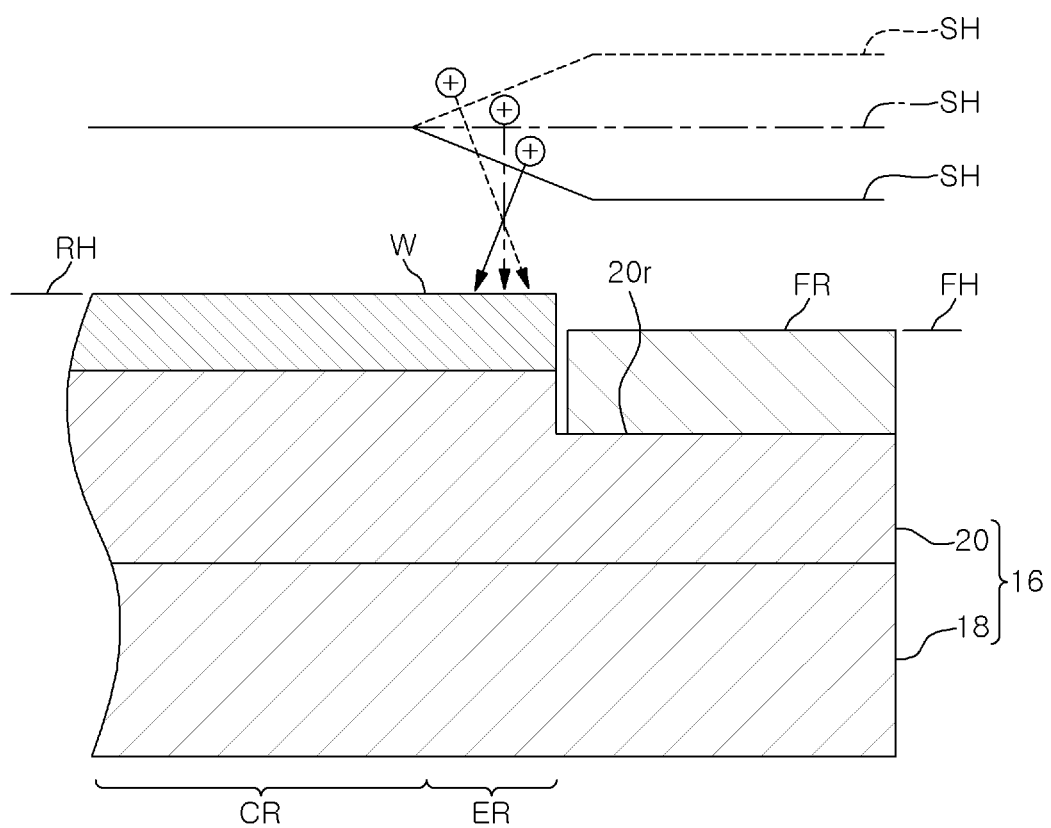
FIG. 4 shows the relation between a shape of a sheath and an incident direction of ions on an edge region of a substrate.

FIG. 4 shows the relationship between the shape of the sheath and the incident direction of ions on the edge region of the substrate. In FIG. 4, circles, each having a cross mark "+" therein, indicate ions. In a state where the position FH in the height direction of the upper surface of the focus ring FR is lower than the position in the height direction of the upper surface of the substrate W, i.e., the reference position RH, and the negative DC voltage is not applied to the focus ring FR, the sheath SET has a shape indicated by a solid line in FIG. 4 (the shape of the boundary between the sheath SH and the plasma). In other words, in a state where the position FH in the height direction of the upper surface of the focus ring FR is lower than the reference position RH and the negative DC voltage is not applied to the focus ring FR, the position in the height direction of the sheath SH above the focus ring FR is lower than the position in the height direction of the sheath SH above a central region CR of the substrate H, and the position in the height direction of the sheath SH above an edge region ER of the substrate H becomes lower as the distance from the center of the substrate H increases. Therefore, in a state where the position FH in the height direction of the upper surface of the focus ring FR is lower than the reference position RH and the negative DC voltage is not applied to the focus ring FR, the incident direction of ions in the plasma on the edge region of the substrate W is inclined inwardly with respect to the vertical direction.

In the method MT1, the negative DC voltage is applied to the focus ring FR in a state where the position FH is set to be lower than the reference position RH. When an absolute value of the DC voltage is smaller than an absolute value of the negative DC voltage to be applied to the focus ring FR to make ions incident vertically on the edge region ER of the substrate W, the incident direction of the ions in the plasma on the edge region of the substrate W is inclined inwardly with respect to the vertical direction. When the absolute value of the negative DC voltage applied to the focus ring FR is adjusted and the ions are incident vertically on the edge region ER of the substrate W, the sheath SH has a shape indicated by a dashed-dotted line in FIG. 4. In other words, when ions are incident vertically on the edge region ER of the substrate W, the position in the height direction of the sheath SH is constant from the central region of the substrate W to the region above the focus ring FR.

When the absolute value of the negative DC voltage applied to the focus ring FR is greater than the absolute value of the negative DC voltage to be applied to the focus ring FR to make ions incident vertically on the edge region ER of the substrate W, the sheath SH has a shape indicated by a broken line in FIG. 4 (the shape of the boundary between the sheath SH and the plasma). In other words, when the absolute value of the negative DC voltage applied to the focus ring FR is greater than the absolute value of the negative DC voltage to be applied to the focus ring FR to make ions incident vertically on the edge region ER of the substrate W, the position in the height direction of the sheath SH above the focus ring FR is higher than the position in the height direction of the sheath SH above the central region CR of the substrate W and the position in the height direction of the sheath SH above the edge region ER of the substrate W becomes higher as the distance from the center of the substrate W increases. Therefore, when the absolute value of the negative DC voltage applied to the focus ring FR is greater than the absolute value of the negative DC voltage to be applied to the focus ring FR to make ions incident vertically on the edge region ER of the substrate W, the incident direction of ions in the plasma on the edge region ER of the substrate W is inclined outwardly with respect to the vertical direction.

Therefore, in accordance with the method MT1, it is possible to control the incident direction of ions on the edge region ER of the substrate W to a desired direction between a direction inwardly inclined with respect to the vertical direction and a direction outwardly inclined with respect to the vertical direction by adjusting the absolute value of the negative DC voltage applied to the focus ring FR. The "inwardly inclined direction" is a direction that becomes closer to the center of the substrate as the distance from the substrate decreases. The "outwardly inclined direction" is a direction that becomes farther from the center of the substrate as the distance from the substrate decreases.

Figure 5A:
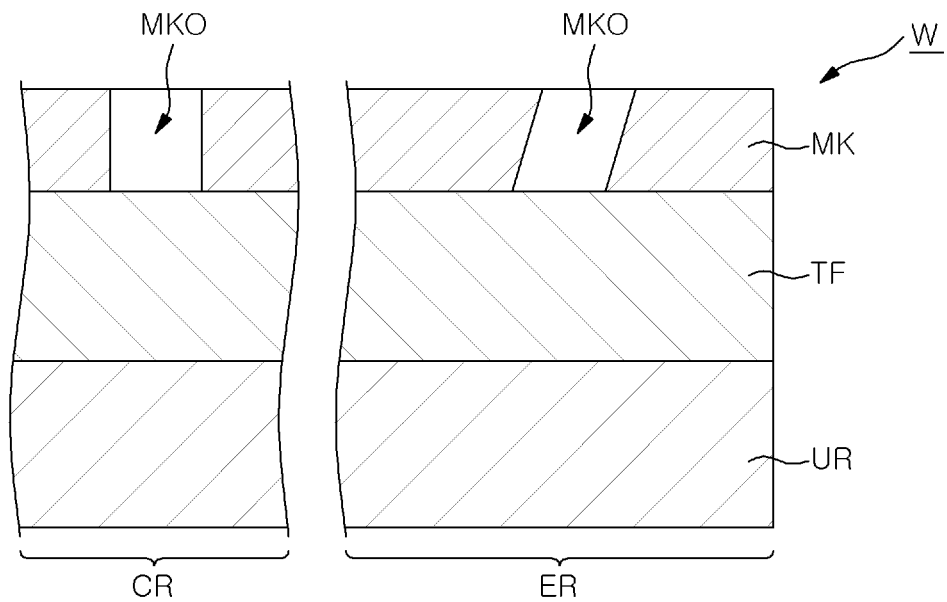
FIG. 5A is a partially enlarged cross-sectional view of an exemplary substrate to which the plasma processing method according to various embodiments can be applied.

As shown in FIG. 1, the method MT1 may further include steps ST12, ST13 and ST14. The steps ST12 to ST14 are executed between the step ST11 and the step ST15. FIG. 5A is a partially enlarged cross-sectional view of an exemplary substrate to which a plasma processing method according to various embodiments can be applied. The substrate W shown in FIG. 5A has the central region CR and the edge region ER. The central region CR is disposed at a radially inner side of the substrate W with respect to the edge region ER. The substrate W shown in FIG. 5A has a film TF and a mask MK. The film TF is provided on an underlying layer UR. The mask MK is provided on the film TF. The mask MK is patterned to provide an opening MKO in each of the central region CR and the edge region ER. The mask MK is, e.g., a resist mask.

Figure 5B:
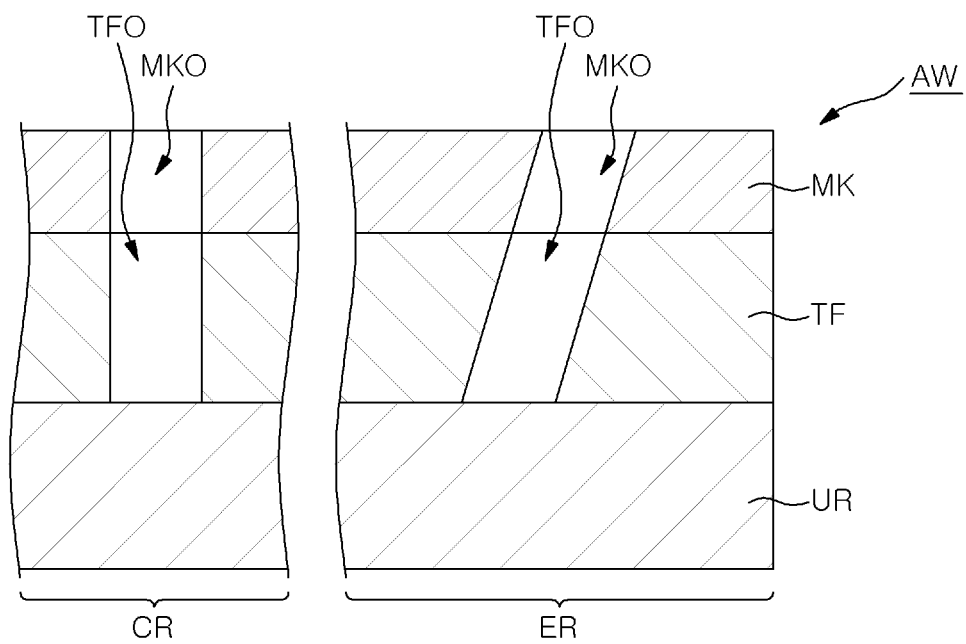
FIG. 5B is a partially enlarged cross-sectional view showing a state of another substrate after plasma processing.

In the method MT1 shown in 1, after the execution of the step ST11 and before the execution of the step ST12, a substrate AW is loaded into the inner space 10s and mounted on the supporting table 16 (the electrostatic chuck 20) in the region surrounded by the focus ring FR. The substrate AW has the same configuration as that of the substrate W to which the plasma processing is applied in the step ST15. In other words, the substrate AW has a film TF and a mask MK. In the step ST12, the plasma processing is performed on the substrate AW in a state where the position FH of the focus ring FR set in the step ST11 is maintained. The plasma process performed on the substrate AW in the step ST12 is the same as the plasma processing performed on the substrate W in the step ST15. FIG. 5B is a partially enlarged cross-sectional view showing a state of another substrate after the plasma processing. When the step ST12 is executed, an opening TFO is formed in the film TF of another substrate AW as shown in FIG. 5B. In other words, the plasma processing of the steps ST12 and ST15 is plasma etching.

Next, in the step ST13, the amount of inclination of the opening TFO formed in the film TF in the edge region ER of another substrate AW is measured. The amount of inclination can be obtained from an optical image of another substrate AW, for example. The amount of inclination may be any amount as long as it indicates the degree of inclination of the opening TFO formed in the film TF in the edge region ER of another substrate AW with respect to the vertical direction. The amount of inclination may be, e.g., an inclination angle of the opening TFO formed in the film TF in the edge region ER of another substrate AW with respect to the vertical direction. Alternatively, the amount of inclination may be the amount of deviation in the horizontal direction between the central positions of upper and lower ends of the opening TFO formed in the film TF in the edge region ER of another substrate AW. The amount of inclination may be measured by a measuring device provided in the plasma processing apparatus 1 or may be measured by a measuring device provided outside the plasma processing apparatus 1.

In the step ST14, the voltage value of the negative DC voltage applied to the focus ring FR in the step ST16 is determined. The voltage value of the negative DC voltage is determined by the amount of inclination measured in the step ST13. For example, the control unit MC specifies the voltage value of the negative DC voltage which corresponds to the measured amount of inclination by using a table or a function in which the relation between the amount of inclination and the voltage value of the negative DC voltage is preset.

Figure 6:
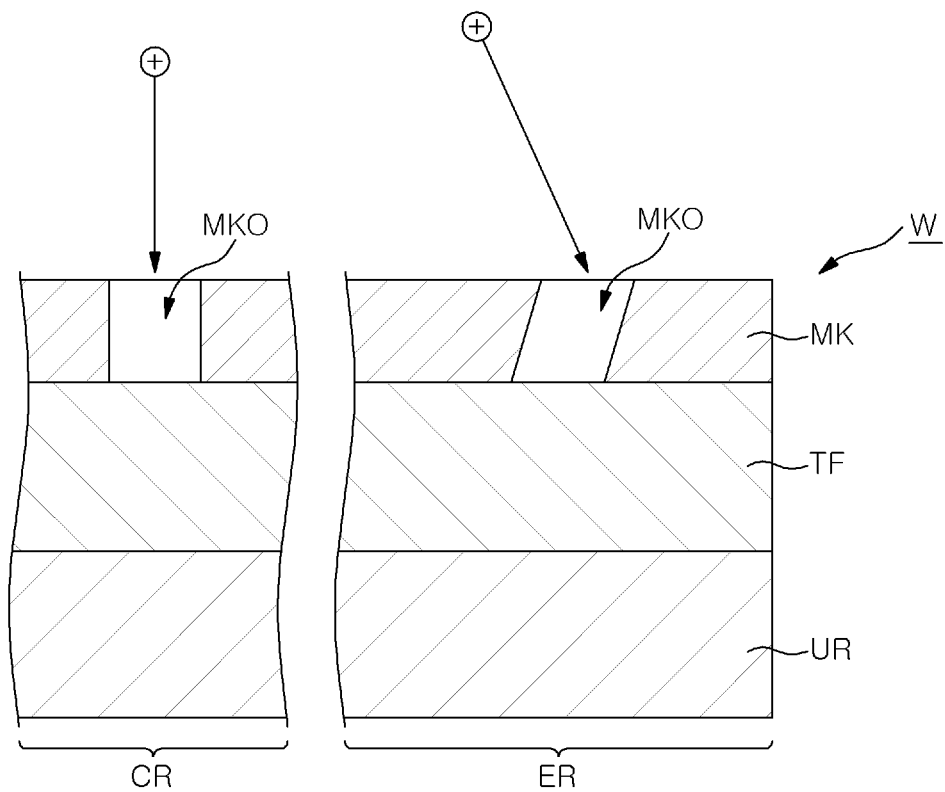
FIG. 6 shows an example of an incident direction of ions in the case of applying a negative DC voltage to the focus ring.
Figure 7:
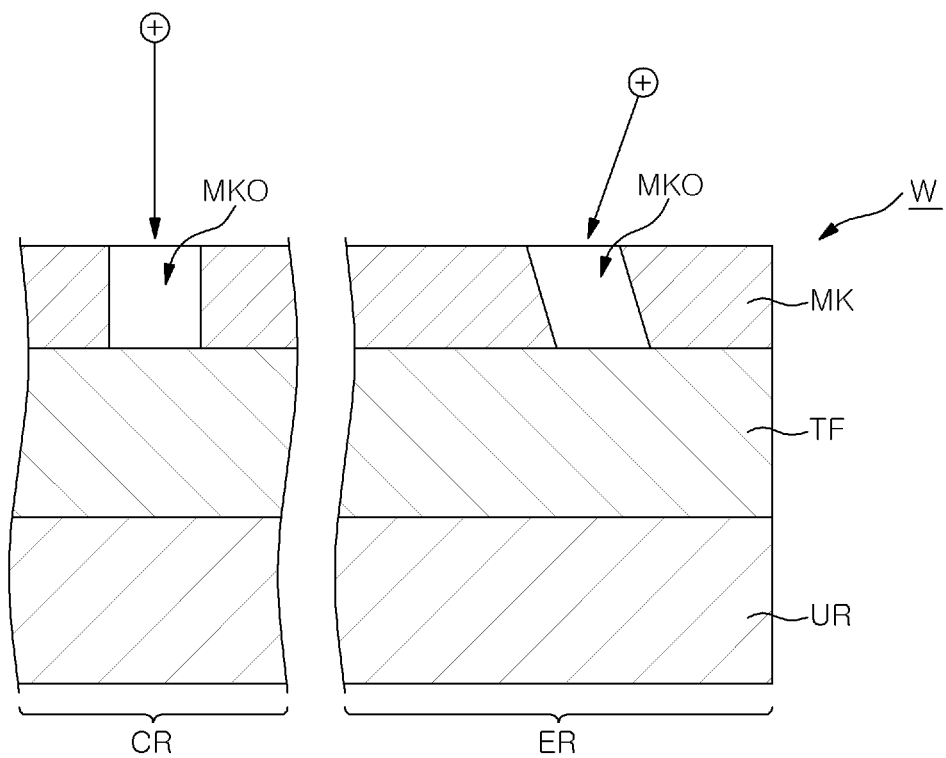
FIG. 7 shows another example of the incident direction of ions in the case of applying a negative DC voltage to the focus ring.

In the step ST14, the voltage value of the negative DC voltage is determined by the measured amount of inclination such that a vertically extending opening is formed in the film TF in the edge region ER of the substrate W, for example. FIG. 6 shows an example of the incident of ions in the case of applying a negative DC voltage to the focus ring. FIG. 7 shows another example of the incident direction of ions in the case of applying a negative DC voltage to the focus ring. In FIGS. 6 and 7, circles, each having a cross mark "+" therein, indicate ions, and arrows extending from those circles indicate the incident directions of the ions.

In one example when the opening TFO formed in the film TF in the edge region ER of another substrate AW extends in a direction inclined inwardly with respect to the vertical direction, the voltage value, of the negative DC voltage is determined by the amount of inclination measured in the step ST13 such that the incident direction of ions on the edge region ER of the substrate W is inclined outwardly as shown in FIG. 6. As a result, a substantially vertically extending opening is formed in the film TF in the edge region ER of the substrate W by the plasma processing of the step ST15. In order to obtain the incident direction of the ions shown in FIG. 6, the absolute value of the negative DC voltage is set to be greater than the absolute value of the negative DC voltage to be applied to the focus ring FR to make ions incident vertically on the edge region ER of the substrate W.

In another example, when the opening TFO formed in the film TF in the edge region ER of another substrate AW extends in a direction inclined outwardly with respect to the vertical direction, the voltage value of the negative DC voltage is determined by the amount of inclination measured in the step ST13 such that the incident direction of ions on the edge region ER of the substrate W is inclined inwardly as shown in FIG. 7. As a result, a substantially vertically extending opening is formed in the film TF in the edge region ER of the substrate W by the plasma processing of the step ST15. In order to obtain the incident, direction of the ions shown in FIG. 7, the absolute value of the negative DC voltage is set to be greater than the absolute value of the negative DC voltage to be applied to the focus ring FR to make ions incident vertically on the edge region ER of the substrate W.

In the step ST14, the voltage value of the negative DC voltage may be determined such that the amount of inclination of the opening formed in the film TF in the edge region ER of the substrate W becomes the specified amount.

In the method MT1, before the execution of the step ST15, the plasma processing of the step ST12, i.e., the etching, may be performed on another substrate in a state where the DC voltage having the voltage value determined in the step ST14 is applied to the focus ring FR. When the characteristics of the etching performed on another substrate are desired ones, the step ST15 may be executed on the substrate W. The etching characteristic may be expressed as the above-described amount of inclination. Alternatively, the etching characteristics may be a state of etching performed on another substrate or may be any characteristics as long as they indicate a sheath state. Such characteristics may be, e.g., characteristics indicating in-plane uniformity of the etching.

Figure 8:
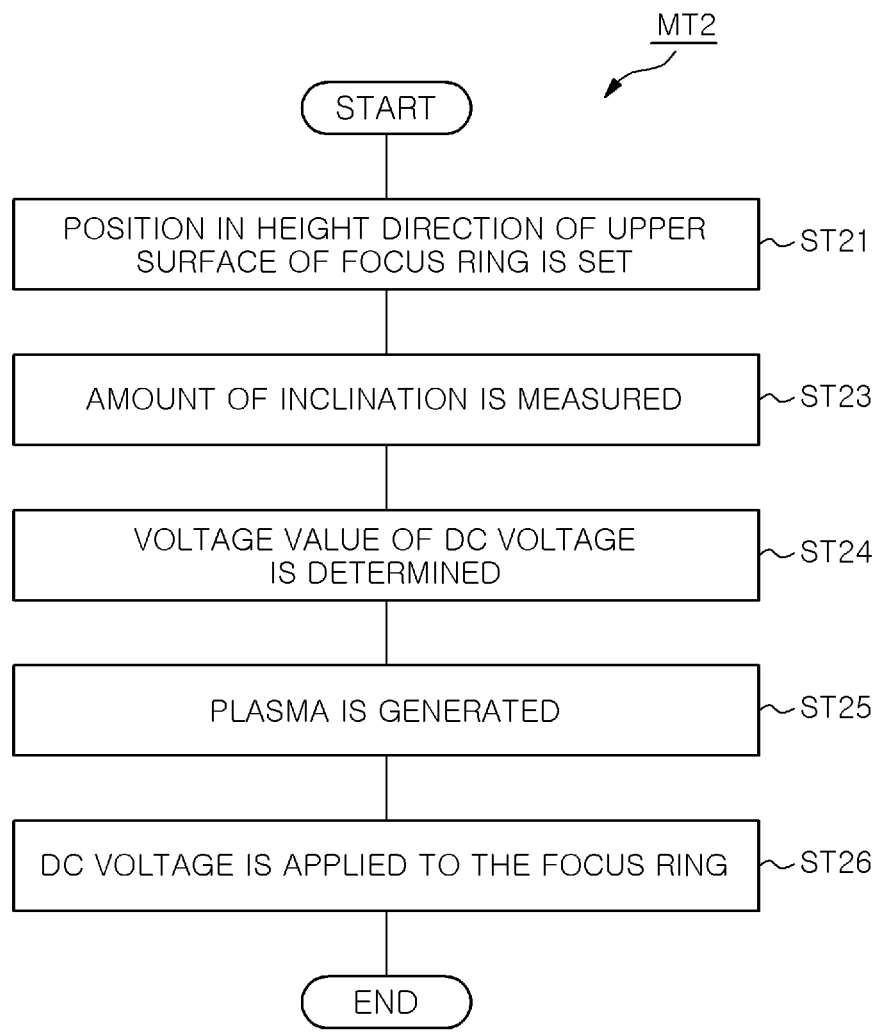
FIG. 8 is a flowchart showing a plasma processing method according to another embodiment.

Hereinafter, a plasma processing method according to another embodiment will be described. FIG. 8 is a flowchart showing the plasma processing method according to another embodiment. The plasma processing method (hereinafter, referred to as "method MT2") shown in FIG. 8 is performed by using a plasma processing apparatus capable of applying a DC voltage to the focus ring, such as the plasma processing apparatus 1. The method MT2 includes a step ST21 that is the same as the step ST11, a step ST25 that is the same as the step ST15, and a step ST26 that is the same as the step ST16. The details of the steps ST21, ST25 and ST26 are the same as those of the steps ST11, ST15 and ST16.

The method MT2 can be applied to the substrate W shown in FIG. 5A. The method MT2 further includes steps ST23 and ST24. The steps ST23 and ST24 are executed between the step ST21 and the step ST25. The step ST23 may be executed before the step ST21.

In the step ST23, the amount of inclination of the opening MKO of the mask MK in the edge region ER of the substrate W is measured. The amount of inclination is obtained from, e.g., an optical image of another substrate AW. The amount of inclination may be any amount as long as it indicates the degree of inclination of the opening MKO of the mask MK with respect to the vertical direction in the edge region ER of the substrate W. The amount of inclination may be, e.g., an inclination angle of the opening MKO of the mask MK in the edge region ER of the substrate W with respect to the vertical direction. Alternatively, the amount of inclination may be the amount of deviation in the horizontal direction between the central positions of upper and lower ends of the opening MKO of the mask MK in the edge region ER of the substrate W.

In the step ST24, the voltage value of the negative DC voltage applied to the focus ring FR in the step ST26 is determined. The voltage value of the negative DC voltage is determined by the amount of inclination measured in the step ST23. For example, the control unit MC specifies the voltage value of the negative DC voltage which corresponds to the measured amount of inclination by using a table or a function in which the relation between the amount of inclination and the voltage value of the negative DC voltage is preset.

In the step ST24, the voltage value of the negative DC voltage is determined by the measured amount of inclination such that a vertically extending opening is formed in the film TF in the edge region ER of the substrate W, for example. In one example, as shown in FIG. 6, when the opening MKO of the mask MK extends in a direction inclined inwardly with respect to the vertical direction in the edge region ER of the substrate W, the voltage value of the negative DC voltage determined by the amount or inclination measured in the step ST23 such that the incident direction of ions on the edge region ER of the substrate W is inclined outwardly. As a result, a substantially vertically extending opening is formed in the film TF in the edge region ER of the substrate W by the plasma processing of the step ST25. In order to obtain the incident direction of ions shown in FIG. 6, the absolute value of the negative DC voltage is set to be greater than the absolute value of the negative DC voltage to be applied to the focus ring FR to make ions incident vertically on the edge region ER of the substrate W.

In another example, as shown in FIG. 7, when the opening MKO of the mask MK extends in a direction inclined outwardly with respect to the vertical direction in the edge region ER of the substrate W, the voltage value of the negative voltage is determined by the amount of inclination measured in the step ST23 such that the incident direction of the ions on the edge region ER of the substrate W is inclined inwardly. As a result, a substantially vertically extending opening is formed in the film TF in the edge region ER of the substrate W by the plasma processing of the step ST25. In order to obtain the incident direction of ions shown in FIG. 7, the absolute value of the negative DC voltage is set to be smaller than the absolute value of the negative DC voltage to be applied to the focus ring FR to make the ions incident vertically on the edge region ER of the substrate W.

In the step ST24, the absolute value of the negative DC voltage may be determined such that the amount of inclination of the opening formed in the film TF in the edge region ER of the substrate W becomes the specified amount.

Figure 9:
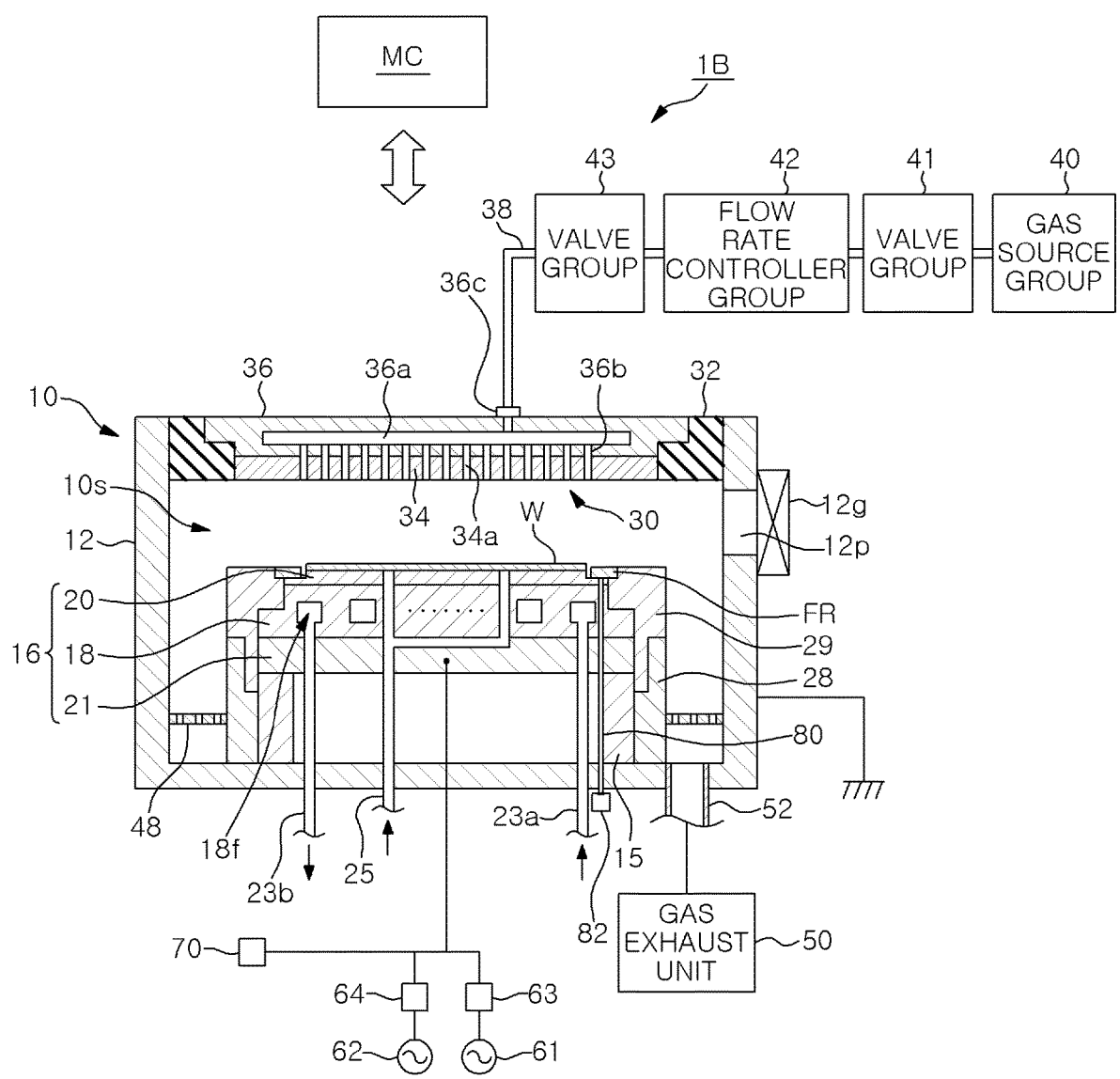
FIG. 9 schematically shows another plasma processing apparatus that can be used in the plasma processing method according to various embodiments.

Hereinafter, another plasma processing apparatus that can be used instead of the plasma processing apparatus 1 in both of the methods MT1 and MT2 will be described. FIG. 9 schematically shows another plasma processing apparatus that can be used in a plasma processing method according to various embodiments. A plasma processing apparatus 1B shown in FIG. 9 is different from the plasma processing apparatus 1 in that it includes a lift mechanism for the focus ring FR.

The lift mechanism for the focus ring FR in the plasma processing apparatus 1B includes a support 80 and a driving unit 82. The support 80 is configured to support the focus ring FR on the supporting table 16. The support 80 may include one or more columns. The support 80 extends from a bottom portion of the supporting table 16 to a position above the supporting table 16 through a through-hole vertically penetrating through the supporting table 16. Below the supporting table 16, the support 80 is connected to the driving unit 82. The driving unit 82 generates power for raising and lowering the focus ring FR through the support 80. The driving unit 82 may be, e.g., a motor. Alternatively, the drive 82 may be an air cylinder.

In the case of performing the method MT1 by using the plasma processing apparatus 1B, in the step ST11, the focus ring is moved in the chamber 10 such that the position FH in the height direction of the upper surface of the focus ring FR becomes lower than the reference position RH. In the step ST11, the focus ring FR is moved by the lift mechanism for the focus ring FR in the plasma processing apparatus 1B. In the case of performing the method MT2 by using the plasma processing apparatus 1B, in the step ST21, the focus ring FR is moved in the chamber 10 such that the position FH in the height direction of the upper surface of the focus ring FR becomes lower than the reference position RH. In the step ST21, the focus ring FR is moved by the lift mechanism for the focus ring FR in the plasma processing apparatus 1B.

As another example, the focus ring may be replaced with a focus ring made of a material having a different electric resistivity in order to change the position in the height direction of the sheath (incident angle of ions). The electric resistivity of the focus ring may be changed by changing the material of the focus ring, or the electric resistivity of the focus ring may be controlled by changing the concentration of the impurities added to the material of the focus ring (for example, Si and SiC of a high electric resistivity, Si and SiC of a low electric resistivity, or the like). In this way, it is possible to change potential on the focus ring, and thus the initial position of the sheath can be changed to control the incident angle of ions. For example, in case of the focus rings having the same thickness, by replacing the focus ring having a low electric resistivity with a focus ring having a high electric resistivity, the initial upper position of the sheath is lowered. As described above, the shape of the sheath can also be controlled by changing the electric resistivity of the focus ring.

While various embodiments have been described, the present disclosure can be variously modified without being limited to the above-described embodiments. For example, the plasma processing apparatus that can be used in each of the methods MT1 and MT2 is not limited to the capacitively coupled plasma processing apparatus. The plasma processing apparatus that can be used in each of the methods MT1 and MT2 may be an inductively coupled plasma processing apparatus or a plasma processing apparatus using a surface wave such as a microwave.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing method comprising:
   setting a position in a height direction of an upper surface of a focus ring that surrounds an edge of a substrate mounted on a supporting table in a chamber of a plasma processing apparatus;
   generating plasma in the chamber to perform plasma processing on the substrate in a state where the position in the height direction of the upper surface of the focus ring is maintained; and
   applying a negative DC voltage to the focus ring in a state where the position in the height direction of the upper surface of the focus ring is maintained during the generation of the plasma,
   wherein in said setting, the focus ring, which has a thickness set such that the position in the height direction of the upper surface of the focus ring mounted on a mounting region of the supporting table is lower than a reference position that is a position in a height direction of an upper surface of the substrate mounted on the supporting table, is loaded into the chamber and mounted on the mounting region to surround the edge of the substrate, or the focus ring is moved in the chamber such that the position in the height direction of the upper surface of the focus ring becomes lower than the reference position.

2. The plasma processing method of claim 1, wherein the substrate has a film and a mask provided on the film,
   the method further comprising:
   performing the plasma processing on another substrate having the film and the mask; and
   measuring the amount of inclination of an opening formed in the film in an edge region of said another substrate by the plasma processing,
   wherein a voltage value of the negative DC voltage is determined by the amount of inclination.

3. The plasma processing method of claim 1, wherein the substrate has a film and a mask provided on the film,
the method further comprising:
measuring the amount of inclination of an opening of the mask in an edge region of the substrate,
wherein a voltage value of the negative DC voltage is determined by the amount of inclination.

4. The plasma processing method of claim 2, wherein the amount of inclination is an inclination angle of the opening formed in the film with respect to a vertical direction.

5. The plasma processing method of claim 3, wherein the amount of inclination is an inclination angle of the opening of the mask with respect to a vertical direction.

6. The plasma processing method of claim 2, wherein the amount of inclination is an amount of deviation in a horizontal direction between upper and lower ends of the opening formed in the film.

7. The plasma processing method of claim 3, wherein the amount of inclination is an amount of deviation in a horizontal direction between upper and lower ends of the opening of the mask.

8. The plasma processing method of claim 2, wherein the amount of inclination is measured by a measuring device provided outside the plasma processing apparatus.

9. The plasma processing method of claim 2, wherein the amount of inclination is measured by a measuring device provided in the plasma processing apparatus.

10. The plasma processing method of claim 2, wherein the mask is a resist mask.

11. The plasma processing method of claim 3, wherein when the opening of the mask extends in a direction inclined inwardly with respect to a vertical direction in the edge region of the substrate, the voltage value of the negative DC voltage is determined such that an incident direction of ions on the edge region of the substrate is inclined outwardly.

12. The plasma processing method of claim 3, wherein when the opening of the mask extends in a direction inclined outwardly with respect to a vertical direction in the edge region of the substrate, the voltage value of the negative DC voltage is determined such that an incident direction of ions on the edge region of the substrate is inclined inwardly.

13. The plasma processing method of claim 2, wherein when the opening of the film in the edge region of the another substrate extends in a direction inclined inwardly with respect to a vertical direction in the edge region of the another substrate, the voltage value of the negative DC voltage is determined such that an incident direction of ions on the edge region of the substrate is inclined outwardly.

14. The plasma processing method of claim 2, wherein when the opening of the film in the edge region of the another substrate extends in a direction inclined outwardly with respect to a vertical direction in the edge region of the another substrate, the voltage value of the negative DC voltage is determined such that an incident direction of ions on the edge region of the substrate is inclined inwardly.

15. The plasma processing method of claim 2, wherein the voltage value of the negative DC voltage is determined by using a table or a function in which a relation between the amount of inclination and the voltage value of the negative DC voltage is preset.

16. The plasma processing method of claim 3, wherein the voltage value of the negative DC voltage is determined by using a table or a function in which a relation between the amount of inclination and the voltage value of the negative DC voltage is preset.

* * * * *